(12) United States Patent
Park et al.

(10) Patent No.: US 11,508,492 B2
(45) Date of Patent: Nov. 22, 2022

(54) RADIOISOTOPE BATTERY

(71) Applicant: ELECTRONICS AND TELECOMMUNICATIONS RESEARCH INSTITUTE, Daejeon (KR)

(72) Inventors: Seong Mo Park, Daejeon (KR); Tae Wook Kang, Daejeon (KR); Kyung Hwan Park, Daejeon (KR); Byounggun Choi, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 299 days.

(21) Appl. No.: 16/843,486

(22) Filed: Apr. 8, 2020

(65) Prior Publication Data

US 2020/0328006 A1 Oct. 15, 2020

(30) Foreign Application Priority Data

Apr. 10, 2019 (KR) .......... 10-2019-0042111

(51) Int. Cl.
*G21H 1/06* (2006.01)
*H01L 31/115* (2006.01)
*H01L 31/0216* (2014.01)

(52) U.S. Cl.
CPC .......... *G21H 1/06* (2013.01); *H01L 31/02164* (2013.01); *H01L 31/115* (2013.01)

(58) Field of Classification Search
CPC .... G21H 1/06; H01L 31/02164; H01L 31/115
See application file for complete search history.

(56) References Cited

U.S. PATENT DOCUMENTS

| 8,487,392 | B2 | 7/2013 | Spencer et al. |
| 9,530,529 | B2 | 12/2016 | Choi et al. |
| 2012/0161575 | A1 | 6/2012 | Choi et al. |
| 2014/0319963 | A1* | 10/2014 | Choi ............ H01L 31/115 310/303 |
| 2015/0075593 | A1 | 3/2015 | Choi et al. |
| 2016/0379729 | A1* | 12/2016 | Roizin ......... H01L 27/142 310/303 |
| 2018/0108446 | A1 | 4/2018 | Cabauy |
| 2018/0211738 | A1* | 7/2018 | Chen ........... H01L 51/441 |

FOREIGN PATENT DOCUMENTS

| KR | 10-2008-0067102 A | 7/2008 |
| KR | 20090038593 A | 4/2009 |
| KR | 20140129404 A | 11/2014 |
| KR | 20150031683 A | 3/2015 |
| KR | 20150047181 A | 5/2015 |
| KR | 20160098915 A | 8/2016 |

* cited by examiner

*Primary Examiner* — Sitaramarao S Yechuri

(57) ABSTRACT

Provided is a radioisotope battery. A radioisotope battery according to exemplary embodiments may include: a substrate; a shield layer disposed on the substrate and including a first material; a source layer embedded in the shield layer and including a second material which is a radioisotope of the first material; a PN junction layer on the shield layer and the source layer; and a window layer between the PN junction layer and the source layer.

17 Claims, 6 Drawing Sheets

RADIOISOTOPE BATTERY

CROSS-REFERENCE TO RELATED APPLICATIONS

This U.S. non-provisional patent application claims priority under 35 U.S.C. § 119 of Korean Patent Application No. 10-2019-0042111, filed on Apr. 10, 2019, the entire contents of which are hereby incorporated by reference.

BACKGROUND

The present disclosure herein relates to a radioisotope battery, and more particularly, to a radioisotope battery including a shield layer.

Radioisotopes are elements which emit radiation having inherent energy and decay into stable isotopes. Decay types of radioisotopes include $\alpha$, $\beta-$, $\beta+$ decays, and an EC decay in which an atomic nucleus captures a K-orbit electron. The radiation intensity of radioisotopes may be expressed by the number of decays occurring in a unit time. Recently, research for producing electrical power using radioisotopes having appropriate radiation intensity has been actively carried out.

Radioisotope batteries are batteries which produce electrical charges inside a semiconductor using radiation generated by radioisotopes. Radioisotopes may emit radiation for several hundred years according to the half-life period thereof. Thus, when manufacturing a battery using radioisotopes, a long service life battery may be manufactured. The efficiency of radioisotope batteries may be improved by selecting an appropriate radiation source. Furthermore, in order to further improve the efficiency of the radioisotope batteries, there is required a study on a structure capable of generating more number of electron-hole pairs in a unit volume using limited radiation sources.

SUMMARY

The present disclosure provides a radioisotope battery which is easily manufactured, is miniaturizable, and has improved safety.

An embodiment of the inventive concept provides a radioisotope battery including: a substrate; a shield layer disposed on the substrate and including a first material; a source layer embedded in the shield layer and including a second material which is a radioisotope of the first material; a PN junction layer on the shield layer and the source layer; and a window layer between the PN junction layer and the source layer.

In an embodiment, the first material may include nickel-62 ($^{62}$Ni) and the second material may include nickel-63 ($^{63}$Ni).

In an embodiment, the shield layer may include nickel-62 ($^{62}$Ni) formed by a low pressure chemical vapor deposition (LPCVD) process, and the source layer may include nickel-63 ($^{63}$Ni) formed by a LPCVD process In an embodiment, the shield layer may include a trench recessed toward the substrate, and the source layer and the window layer may be disposed inside the trench.

In an embodiment, the PN junction layer may include a first n-type semiconductor layer, a second n-type semiconductor layer, and a p-type semiconductor layer sequentially stacked, and the first n-type semiconductor layer may have a higher doping concentration than the second n-type semiconductor layer and the p-type semiconductor layer.

In an embodiment, the radioisotope battery may include an electrode disposed between the shield layer and the PN junction layer and connected to the PN junction layer, wherein the electrode may surround the window layer.

In an embodiment, a lower surface of the window layer may be positioned at a lower level than the lower surface of the electrode.

In an embodiment, the radioisotope battery may include an insulating layer disposed between the electrode and the shield layer and surrounding the window layer.

In an embodiment, the source layer may include a trench recessed toward the substrate.

In an embodiment of the inventive concept, a radioisotope battery includes: a shield layer disposed on a substrate and having a trench recessed toward the substrate; a source layer disposed inside the trench and including a radionuclide; a PN junction layer on the shield layer and the source layer; a window layer between the PN junction layer and the source layer; and a first electrode disposed between the PN junction layer and the shield layer.

In an embodiment, the first electrode may surround the window layer.

In an embodiment, a lower surface of the window layer may be positioned at a lower level than the lower surface of the electrode.

In an embodiment, the radioisotope battery may further include an insulating layer disposed between the electrode and the shield layer and surrounding the window layer.

In an embodiment, the shield layer may include nickel-62 ($^{62}$Ni) and the source layer may include nickel-63 ($^{63}$Ni).

In an embodiment, the shield layer may include nickel-62 ($^{62}$Ni) formed by a low pressure chemical vapor deposition (LPCVD) process, and the source layer may include nickel-63 ($^{63}$Ni) formed by a LPCVD process.

In an embodiment, the PN junction layer may include an n-type semiconductor layer, an n-type semiconductor layer, and a p-type semiconductor layer which are sequentially stacked.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
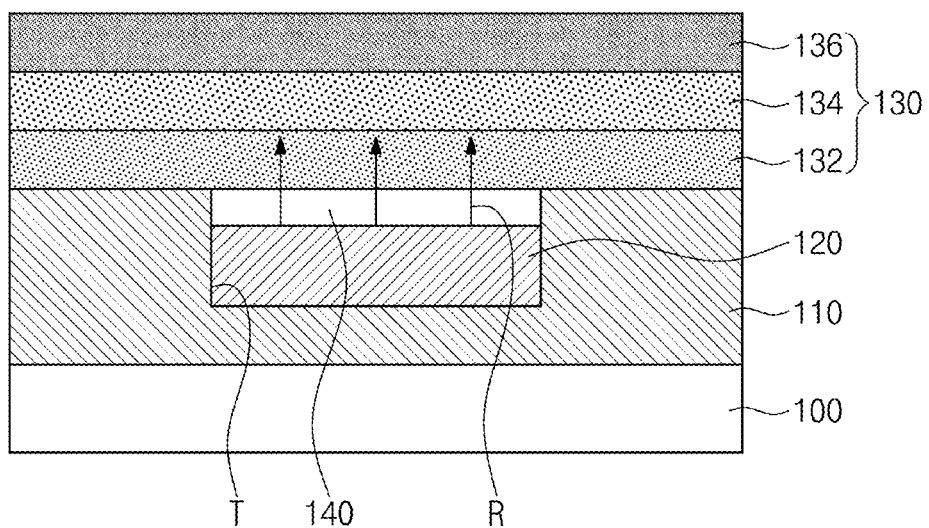
FIG. 1 is a cross-sectional view for describing a radioisotope battery according to exemplary embodiments of the inventive concept.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. Like reference numerals refer to like elements throughout.

The terms used in this specification are used for description of exemplar embodiments, and are not for limiting the exemplary embodiments of the inventive concept. In the specification, singular terms include plural terms unless mentioned otherwise in the statement. The meaning of 'comprises' and/or 'comprising' specifies a property, a region, a fixed number, a step, a process, an element and/or a component but does not exclude other properties, regions, fixed numbers, steps, processes, elements and/or components.

In addition, the exemplary embodiments described in the specification will be described with reference to cross-sectional views and/or plan views which are ideal exemplary views of exemplary embodiments of the present invention. In the drawings, the thicknesses of films and regions are exaggerated for effective description of the technical content. Thus, the shapes of exemplary drawings may be changed according to manufacturing technology and/or allowable errors. Therefore, the embodiments of the present invention are not limited to the specific shapes illustrated in the exemplary views, but may include other shapes that may be created according to manufacturing processes. For example, an etching region depicted in right angles may have a rounded shape or a shape having a predetermined curvature. Thus, areas exemplified in the drawings have general properties, and are used to illustrate specific shapes of element regions. Thus, this should not be construed as limited to the scope of the present invention.

Hereinafter, ion implantation apparatuses according to embodiments of the inventive concept will be described in detail with reference to drawings.

FIG. 1 is a cross-sectional view for describing a radioisotope battery according to an exemplary embodiment of the inventive concept.

Referring to FIG. 1, a radioisotope battery according to exemplary embodiments of the inventive concept may include a substrate 100, a shield layer 110, a source layer 120, a window layer 140, and a PN junction layer 130. The substrate 100 may include, for example, a glass substrate.

The shield layer 110 may be disposed on the substrate 100. The shield layer 110 may at least partially surround the source layer 120, and may prevent radiation R from being emitted to the outside of the radioisotope battery. The shield layer 110 may cover the lower surface and side surfaces of the source layer 120 and expose the upper surface of the source layer 120. The shield layer 110 may include a trench T recessed from the upper surface of the shield layer 110 toward the substrate 100.

The source layer 120 may be disposed inside the trench T. The source layer 120 may generate a radiation R. The radiation R generated by the source layer 120 may be emitted to the outside of the trench T from the upper surface of the source layer 120 exposed by the shield layer 110. The radiation R may include beta particles. The upper surface of the source layer 120 may be positioned on a lower level than the upper surface of the shield layer 110. Thus, the side surfaces of the source layer 120 may not be exposed by the shield layer 110.

The shield layer 110 may include a first material for shielding the radiation R. The first material may include a stable isotope. The source layer 120 may include a second material for generating the radiation R. The second material may include a radionuclide. The first material and the second material may have the same atomic number. The second material may be a radioisotope of the first material. In other words, the first material and the second material may have the same number of protons and different atomic weights. For example, the first material may include nickel-62 ($^{62}$Ni), and the second material may include nickel-63 ($^{63}$Ni). For example, the shield layer 110 may include the nickel-62 ($^{62}$Ni) formed by a low pressure chemical vapor deposition (LPCVD) process, and the source layer 120 may include the nickel-63 ($^{63}$Ni) formed by the LPCVD process.

The PN junction layer 130 may be disposed on the shield layer 110 and the source layer 120. The PN junction layer 130 may be disposed on the uppermost surface of the shield layer 110 and isolate the trench T of the shield layer 110. In other words, the inner space in which the source layer 120 is disposed may be surrounded by the inner side walls of the shield layer 110 and the lower surface of the PN junction layer 130. The PN junction layer 130 may include a first semiconductor layer 132, a second semiconductor layer 134, and a third semiconductor layer 136 which are sequentially stacked. The first semiconductor layer 132, the second semiconductor layer 134, and the third semiconductor layer 136 may include silicon. The first semiconductor layer 132 and the second semiconductor layer 134 may include n-type impurities. At this point, the impurity concentration of the second semiconductor layer 134 may be lower than the impurity concentration of the first semiconductor layer 132. The third semiconductor layer 136 may include p-type impurities. The p-impurity concentration of the third semiconductor layer 136 may be lower than the n-impurity concentration of the first semiconductor layer 132. For example, the first semiconductor layer 132 may be an n-type semiconductor layer, the second semiconductor layer 134 may be an n-type semiconductor layer having a low doping concentration, and the third semiconductor layer 136 may be a p-type semiconductor layer having a low doping concentration. The PN junction layer 130 may receive the radiation R from the source layer 120 and generate an electromotive force. The radiation R may penetrate the PN junction layer 130 by a predetermined depth to generate electron-hole pairs in a space charge region inside the PN junction layer 130, and may not completely penetrate through the PN junction layer 130.

The window layer 140 may be disposed between the PN junction layer 130 and the source layer 120. The penetration depth by which the radiation R penetrates the PN junction layer 130 may be adjusted by the window layer 140. The window layer 140 may cover the upper surface of the source layer 120. At least a portion of the window layer 140 may be disposed inside the trench T of the shield layer 110. For example, the window layer 140 may fill the remaining portion of the trench T in which the source layer 120 is embedded. The window layer 140 may include an insulating material having predetermined beta particle permeability. The window layer 140 may include, for example, a silicon oxide. The thickness of the window layer 140 may be appropriately selected with a range that does not interfere with the penetration of the radiation while preventing electrical interference between the source layer 120 and the PN junction.

Figure 2A:
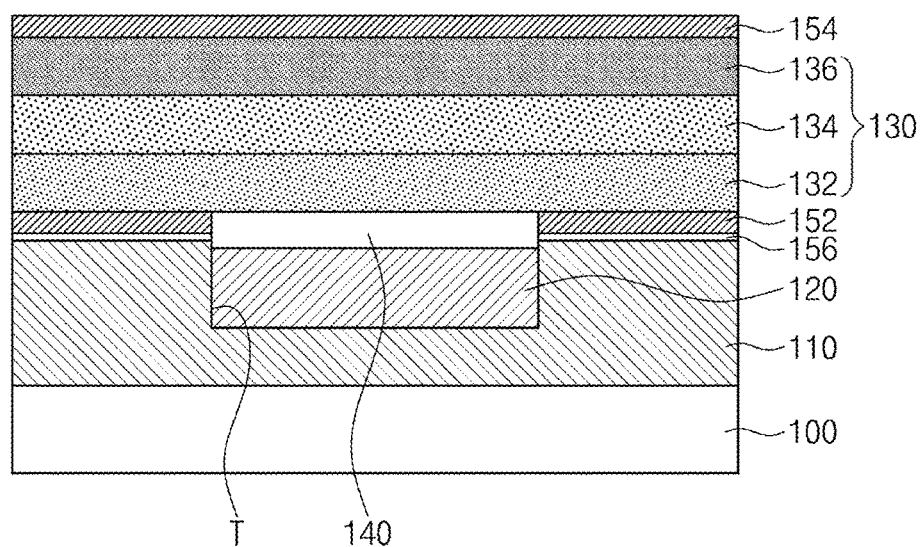
FIG. 2A is a cross-sectional view for describing a radioisotope battery according to exemplary embodiments of the inventive concept.
Figure 2B:
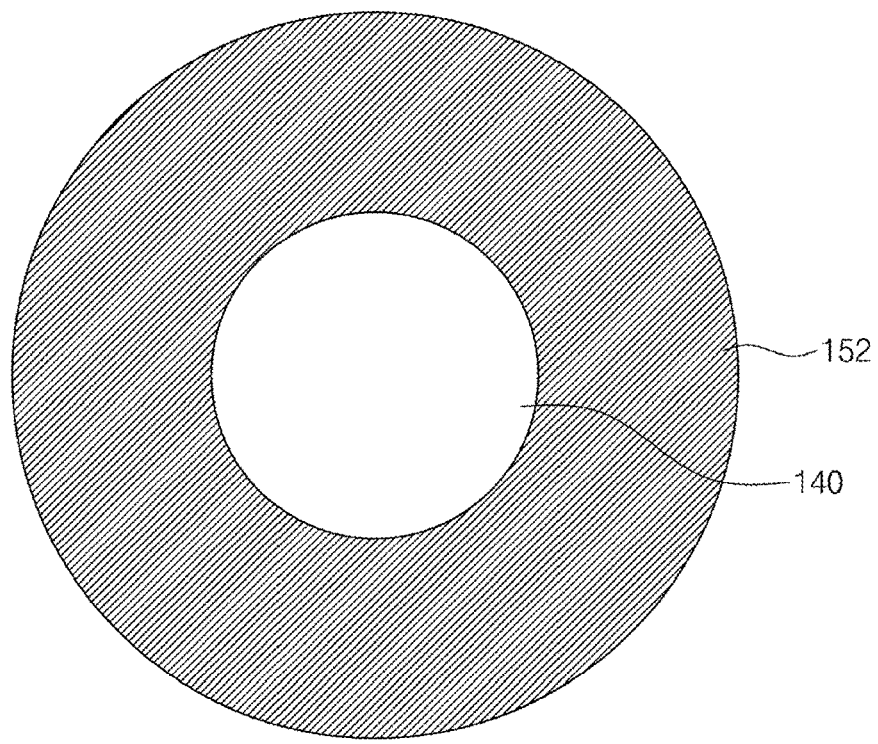
FIG. 2B is a plan view from the top of a first electrode and a window layer of a radioisotope battery according to exemplary embodiments of the inventive concept.

FIG. 2A is a cross-sectional view for describing a radioisotope battery according to exemplary embodiments of the inventive concept. FIG. 2B is a plan view from the top of a first electrode and a window layer of a radioisotope battery according to exemplary embodiments of the inventive concept.

Referring to FIGS. 2A and 2B, a radioisotope battery may further include a first electrode 152 and a second electrode 154 which are connected to the PN junction 130.

The first electrode 152 may be electrically connected to the first semiconductor layer 132. The first electrode 152 may be disposed between the PN junction layer 130 and the shield layer 110. In addition, the first electrode 152 may be disposed on the side surface of the window layer 140. The first electrode 152 may have a closed-curve shape when viewed in a plan view. The first electrode 152 may surround the window layer 140 when viewed in a plan view. For example, the window layer 140 may have a circular shape, and the first electrode 152 may have a circular-ring shape.

An insulating layer 156 may be disposed between the first electrode 152 and the shield layer 110. The substrate 156 may include, for example, a silicon oxide. An insulating layer 156 may electrically insulate the first electrode 152 and the shield layer 110. The insulating layer 156 may be disposed on the side surface of the window layer 140 and have the identical/similar shape to that of the first electrode 152.

The second electrode 154 may be electrically connected to the third semiconductor layer 136. The second electrode 154 may be disposed on the upper surface of the third semiconductor layer 136. The second electrode 154 may transmit the electromotive force generated in the PN junction layer 130 to an external element (not shown) together with the first electrode 152.

Figure 3:
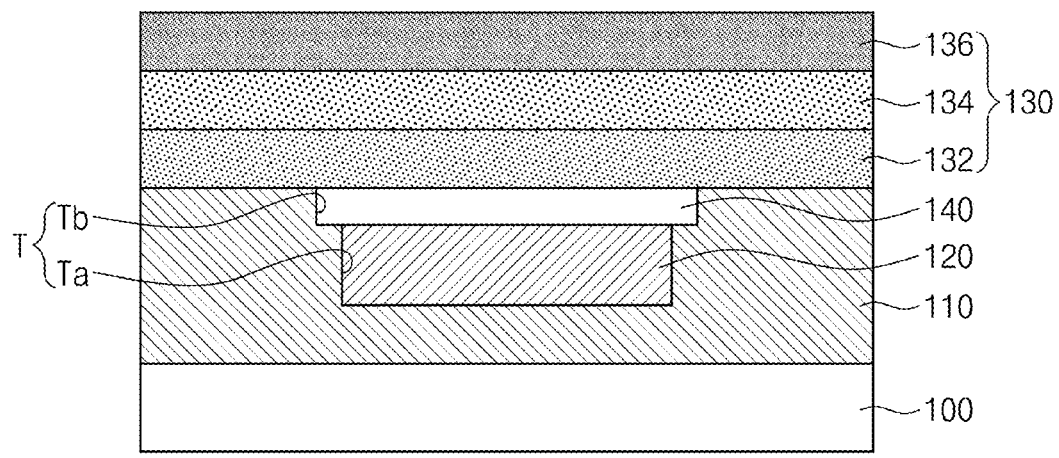
FIGS. 3 to 5 are cross-sectional views for describing radioisotope batteries according to exemplary embodiments of the inventive concept.
Figure 4:
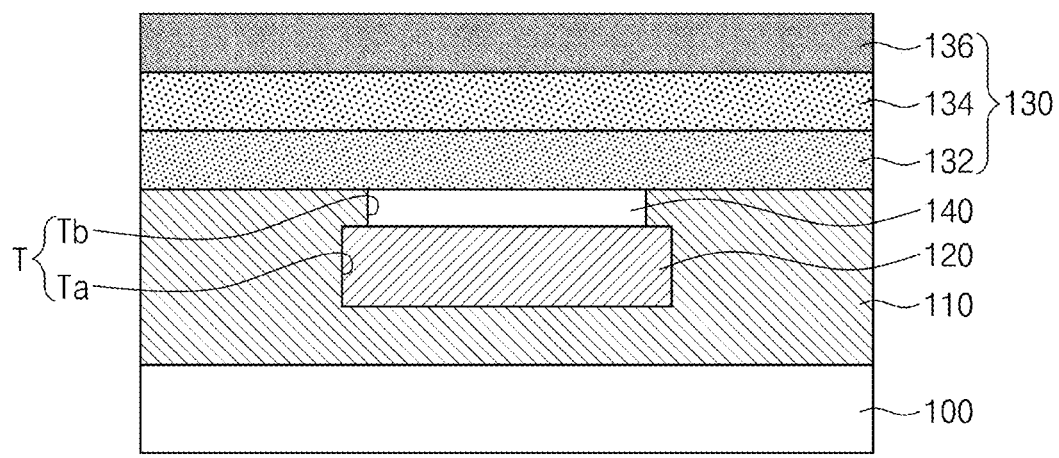
Figure 5:
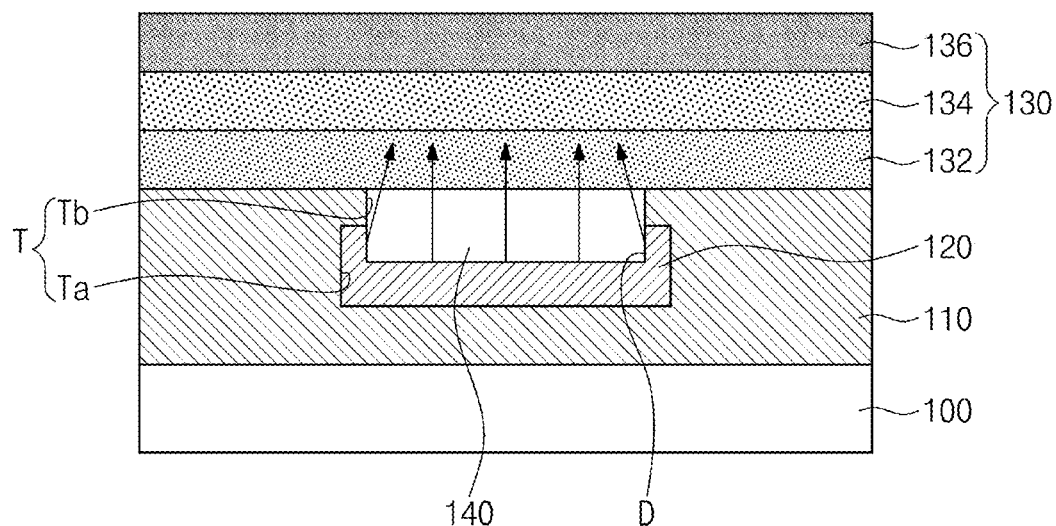

FIGS. 3 to 5 are cross-sectional views for describing radioisotope batteries according to exemplary embodiments of the inventive concept. For simple description, specific description regarding the configurations described with reference to FIGS. 1 to 2B may be omitted.

Referring to FIG. 3, the width of the window layer 140 may be larger than the width of the source layer 120. In this specification, the width may mean the length in a direction parallel to the upper surface of the substrate 100. Specifically, the trench T of the shield layer 110 may include a lower region Ta and an upper region Tb having the larger width than the lower region Ta. The source layer 120 may fill the lower region Ta of the trench T. The window layer 140 may fill the upper region Tb of the trench T. The window layer 140 may completely cover the upper surface of the source layer 120.

Referring to FIG. 4, the width of the window layer 140 may be smaller than the width of the source layer 120. The width of the lower region Ta of the trench T may be smaller than the width Tb of the upper region Tb. The window layer 140 may cover a portion of the upper surface of the source layer 120. The shield layer 110 may cover another portion of the upper surface of the source layer 120.

Referring to FIG. 5, a source layer 120 may include a recess section D recessed from the upper surface thereof toward the lower surface thereof. A window layer 140 may be disposed between the bottom surface of the recess section D and the PN junction layer 130. Specifically, a trench T of the shield layer 110 may include a lower region Ta and an upper region Tb having the smaller width than the lower region Ta. The source layer 120 may fill a portion of the lower region Ta of the trench T. The window layer 140 may fill another portion of the lower region of the trench T and the upper region Tb of the trench T. The source layer 120 including the recess section D may have a larger surface area than the flat-plate like source layer 120 having the same volume. Thus, the intensity of the radiation R may be increased. Th width of the recess section D may substantially the same as the width of the upper region Tb of the trench T. The recess section D and the inner side surfaces of the upper region Tb may be aligned to each other. The width of the window layer 140 may be constant from the bottom surface thereof to the upper surface thereof.

According to exemplary embodiments, the radioisotope batteries described with reference to FIGS. 3 to 5 may further include the first electrode 152 and the second electrode 154 described with reference to FIGS. 2A and 2B. Referring again to FIGS. 3 to 5, a first electrode (not shown) may be disposed between the upper surface of the shield layer 110 and the lower surface of the PN junction layer 130, and a second electrode (not shown) may be disposed on the upper surface of the PN junction layer 130.

FIGS. 6 to 10 are views for describing a method for manufacturing a radioisotope battery according to exemplary embodiments of the inventive concept.

Figure 6:
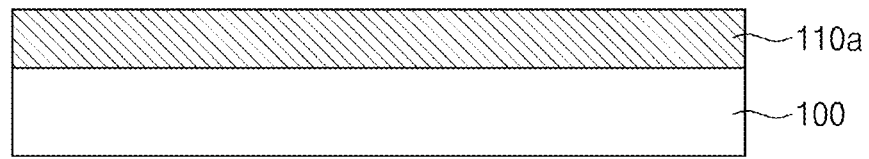
FIGS. 6 to 10 are views for describing a method for manufacturing a radioisotope battery according to exemplary embodiments of the inventive concept.

Referring to FIG. 6, a lower shield layer 110a may be formed on a substrate 100. Forming the lower shied layer 110a may include performing a low pressure chemical vapor deposition (LPCVD) process on the substrate 100.

Figure 7:
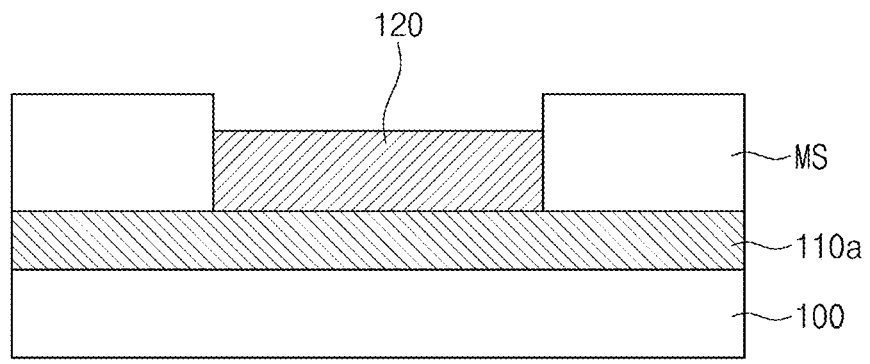

Referring to FIG. 7, a source layer 120 may be formed on the lower shield layer 110a. Before forming the source layer 120, a mask pattern MS may be formed on the lower shield layer 110a. Subsequently, s LPCVD process may be performed and the source layer 120 may be formed on the upper surface of the substrate 100 exposed by the mask pattern MS. According to an exemplary embodiment, the resultants of the LPCVD process which are formed on the mask pattern MS may be removed together as the mask pattern MS is removed.

Figure 8:
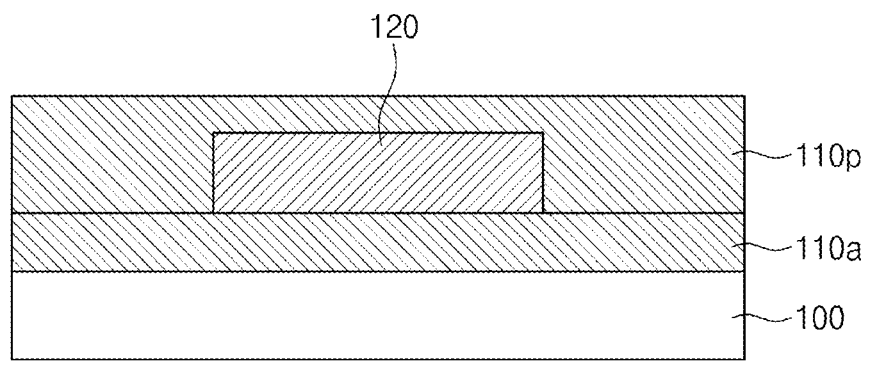

Referring to FIG. 8, a lower shield layer 110a and a preliminary upper shield layer 110p covering the source layer 120 may be formed. The preliminary upper shield layer 110p may be formed through a LPCVD process.

Figure 9:
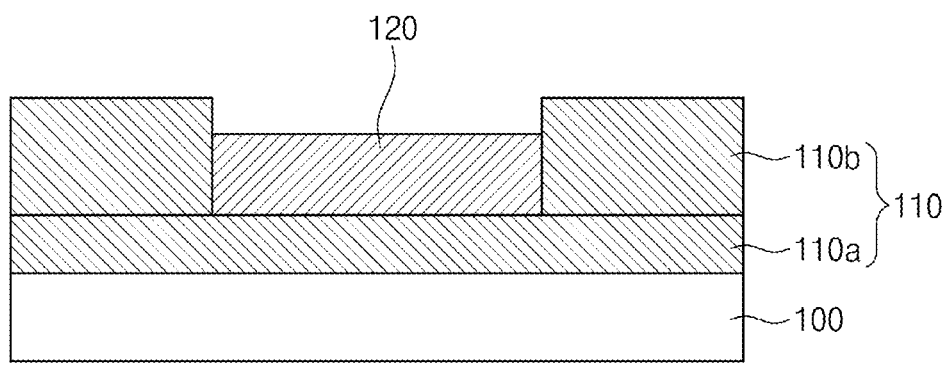

Referring to FIG. 9 with FIG. 8, an upper shield layer 110b may be formed by removing a portion of the preliminary upper shield layer 110p. The upper shield layer 110b may expose a portion of the source layer 120. The upper shield layer 110b may form a shield layer 110 together with the lower shield layer 110a. Removing a portion of the upper shield layer 110b may include forming an etching mask on the preliminary upper shield layer 110p and performing an etching process. According to the shape of the etching mask and the process conditions of the etching process, the exposure area of the upper surface of the source layer 120 may vary as illustrated in FIGS. 1, 3 and 4. While the upper shield layer 110b is etched, the source layer 120 may be etched together, and as illustrated in FIG. 5, a recess section D may be formed in an upper portion of the source layer 120.

Figure 10:
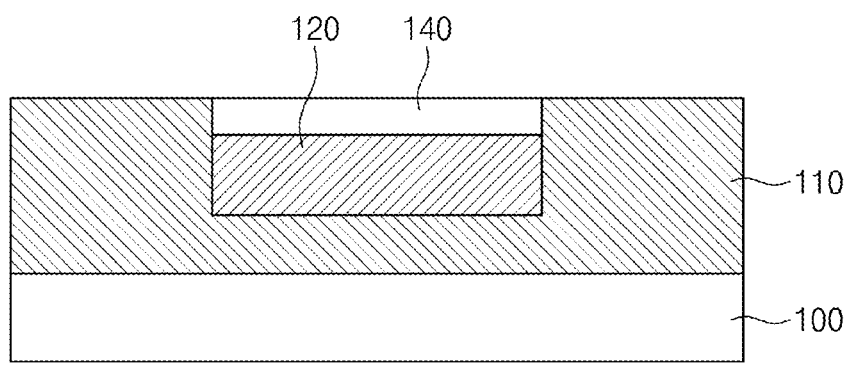

Referring to FIG. 10, a window layer 140 may be formed on the upper surface of the source layer 120. The window layer 140 may be embedded in the shield layer 110 together with the source layer 120. The forming of the window layer 140 may include: forming an insulation film (not shown) on the source layer 120 and the shield layer 110; and removing a portion of the insulating film to expose the upper surface of the shield layer 110.

Referring again to FIG. 1, a PN junction layer 130 may be formed on the shield layer 110 and the source layer 120. The forming of the PN junction layer 130 may include sequentially depositing first to third semiconductor layers 132, 134, and 136. Each of the first to third semiconductor layers 132, 134, and 136 may be doped with p-type or n-type impurities through a doping process. The doping process may be performed as an ion injection process, or be performed in situ together with the deposition process for the first to third semiconductor layers 132, 134 and 136.

According to exemplary embodiments of the inventive concept, a radioisotope battery may be provided which has improved safety, is easily manufactured, and has high energy density.

So far, embodiments of the present invention has been described with reference to the accompanying drawings, but those skilled in the art to which the present invention belongs could understand that the present invention may be implemented in other specific forms without changing the spirit or characteristics thereof. Thus, the above-disclosed embodiments are to be considered illustrative and not restrictive.

What is claimed is:

1. A radioisotope battery comprising:
   a substrate;
   a shield layer disposed on the substrate and including a first material;
   a source layer embedded in the shield layer and including a second material which is a radioisotope of the first material;
   a PN junction layer on the shield layer and the source layer; and
   a window layer between the PN junction layer and the source layer,
   wherein the shield layer comprises a trench recessed toward the substrate, and the source layer and the window layer are disposed inside the trench.

2. The radioisotope battery of claim 1, wherein the first material comprises nickel-62 ($^{62}$Ni) and the second material comprises nickel-63 ($^{63}$Ni).

3. The radioisotope battery of claim 1, wherein
   the shield layer comprises nickel-62 ($^{62}$Ni) formed by a low pressure chemical vapor deposition (LPCVD) process, and
   the source layer comprises nickel-63 ($^{63}$Ni) formed by a LPCVD process.

4. The radioisotope battery of claim 1, wherein
   the PN junction layer include a first n-type semiconductor layer, a second n-type semiconductor layer, and a p-type semiconductor layer sequentially stacked,
   wherein the first n-type semiconductor layer has a higher doping concentration than the second n-type semiconductor layer and the p-type semiconductor layer.

5. The radioisotope battery of claim 1, comprising an electrode disposed between the shield layer and the PN junction layer and connected to the PN junction layer, wherein the electrode surrounds the window layer.

6. The radioisotope battery of claim 5, wherein a lower surface of the window layer is positioned at a lower level than the lower surface of the electrode.

7. The radioisotope battery of claim 5, comprising an insulating layer disposed between the electrode and the shield layer and surrounding the window layer.

8. The radioisotope battery of claim 1, wherein the source layer comprises a recess section recessed toward the substrate.

9. The radioisotope battery of claim 1, wherein a width of the window layer is larger than a width of the source layer, each of the width of the window layer and the width of the source layer being a length in a direction a parallel to an upper surface of the substrate.

10. The radioisotope battery of claim 1, wherein a width of the window layer is smaller than that of the source layer, each of the width of the window layer and the width of the source layer being a length in a direction a parallel to an upper surface of the substrate.

11. A radioisotope battery comprising:
    a shield layer disposed on a substrate and having a trench recessed toward the substrate;
    a source layer disposed inside the trench and including a radionuclide;
    a PN junction layer on the shield layer and the source layer;
    a window layer between the PN junction layer and the source layer; and
    a first electrode disposed between the PN junction layer and the shield layer,
    wherein the PN junction layer comprises an n-type semiconductor layer, an n-type semiconductor layer, and a p-type semiconductor layer which are sequentially stacked.

12. The radioisotope battery of claim 11, wherein the first electrode surrounds the window layer.

13. The radioisotope battery of claim 11, wherein a lower surface of the window layer is positioned at a lower level than the lower surface of the electrode.

14. The radioisotope battery of claim 11, further comprising an insulating layer disposed between the first electrode and the shield layer and surrounding the window layer.

15. The radioisotope battery of claim 11, wherein the shield layer comprises nickel-62 ($^{62}$Ni) and the source layer comprises nickel-63 ($^{63}$Ni).

16. The radioisotope battery of claim 11, wherein
    the shield layer comprises nickel-62 ($^{62}$Ni) formed by a low pressure chemical vapor deposition (LPCVD) process, and
    the source layer comprises nickel-63 ($^{63}$Ni) formed by a LPCVD process.

17. A radioisotope battery comprising:
    a substrate;
    a shield layer disposed on the substrate and including a first material;
    a source layer embedded in the shield layer and including a second material which is a radioisotope of the first material;
    a PN junction layer on the shield layer and the source layer; and
    a window layer between the PN junction layer and the source layer,
    wherein an upper surface of the source layer is positioned at a lower level than an upper surface of the shield layer, and side surfaces of the source layer are covered by the shield layer.

* * * * *